United States Patent [19]

Chiba

[11] Patent Number: 5,898,699
[45] Date of Patent: Apr. 27, 1999

[54] DIGITAL BROADCAST RECEIVER AND SIGNAL LEVEL DISPLAY METHOD

[75] Inventor: Yoshiyuki Chiba, Kanagawa, Japan

[73] Assignee: Sony Corporation, Tokyo, Japan

[21] Appl. No.: 08/874,368

[22] Filed: Jun. 19, 1997

[30] Foreign Application Priority Data

Jun. 28, 1996 [JP] Japan ................... 8-188638

[51] Int. Cl.$^6$ ........................................ G06F 11/00
[52] U.S. Cl. ........................ 371/5.1; 371/64; 371/67.1
[58] Field of Search ...................... 371/5.1, 30, 37.01, 371/37.02, 37.03, 37.4, 64, 67.1, 68.1, 20.1, 20.4, 5.5; 375/227, 268, 318, 269

[56] References Cited

U.S. PATENT DOCUMENTS

| | | |
|---|---|---|
| 4,332,029 | 5/1982 | Campbell et al. ............. 371/5.5 |
| 4,713,810 | 12/1987 | Chum ............................ 371/5.1 |
| 4,920,543 | 4/1990 | Martin .......................... 371/5.1 |
| 5,274,674 | 12/1993 | Lafon ........................... 371/5.5 |
| 5,581,577 | 12/1996 | Abe ............................. 371/5.1 |

*Primary Examiner*—Trinh L. Tu
*Attorney, Agent, or Firm*—Frommer Lawrence & Haug, LLP.; William S. Frommer

[57] ABSTRACT

In displaying an antenna level on a display device, a bit error rate is measured by comparing, by a comparator, output signals of a QPSK demodulator and signals obtained by error-correcting those output signals by an error correction circuit and then again adding error correction codes to error-corrected data by a re-encoding circuit. The gain of an AGC amplifier is controlled in accordance with a measured value of the bit error rate, and an antenna value corresponding to the measured value of the bit error rate is displayed on the display device.

16 Claims, 3 Drawing Sheets

1

DIGITAL BROADCAST RECEIVER AND SIGNAL LEVEL DISPLAY METHOD

BACKGROUND OF THE INVENTION

1. Field of the Invention

The present invention relates to a digital satellite broadcast receiver and an antenna level display method therefor and, more specifically, to a technique for increasing the antenna level range that can be displayed on a real-time basis.

2. Description of the Related Art

To properly receive radio waves of satellite broadcast, it is necessary to adjust a satellite broadcast receiving antenna (hereinafter referred to simply as "antenna") so that it is correctly directed to a satellite. In the case of a conventional analog satellite broadcast receiver, the direction of an antenna is adjusted so that the level of a BS-IF signal as an output signal of a BS converter or an AGC voltage of a BS tuner becomes maximum.

However, the direct application of the above adjustment method for an analog satellite broadcast receiver to a digital satellite broadcast receiver cannot realize level display that is specific to digital equipment.

In view of the above, it is conceivable to calculate the antenna level from the bit error rate of a demodulation output. However, even if a receiver is so constructed as to count errors in a demodulation output and display a count value, it cannot provide wide-range level display as performed in analog satellite broadcast receivers.

TABLE 1

| C/N (dB) | Bit error rate (Theoretical value) | Time taken to observe one error |
|---|---|---|
| 14 | $4 \times 10^{-6}$ | 6 msec |
| 15 | $3 \times 10^{-7}$ | 83 msec |
| 16 | $1 \times 10^{-8}$ | 2.5 sec |
| 17 | $1.4 \times 10^{-10}$ | 179 sec |
| 18 | $8 \times 10^{-13}$ | 8.7 hours |

This is because as the C/N value increases in a range larger than 15 dB, the time taken to observe one error steeply increases as shown in Table 1 and hence it becomes more difficult (actually, very difficult) to display the error rate on a real-time basis. Numerical values in Table 1 are those in a case of receiving a QPSK signal of a transmission rate 42 Mbps.

For the above reason, in adjusting the direction of an antenna, it is difficult to judge C/N values larger than 15 dB. In the case of antennas whose diameter is as small as 40–50 cm, judgment of C/N values smaller than about 14 dB is sufficient because such antennas do not have an ability of providing large reception C/N values. However, in the case of antennas whose diameter is larger than 75 cm and hence which can provide large reception C/N values, the antenna adjustment cannot be conducted with high accuracy.

SUMMARY OF THE INVENTION

The present invention has been made in view of the above problem in the art, and an object of the invention is therefore to enable a highly accurate antenna adjustment in a digital satellite broadcast receiver by increasing the reception C/N value range that can be displayed.

According to the invention, there is provided a digital broadcast receiver comprising measuring means for measuring a bit error rate of a received digital broadcast signal; display means for displaying a reception signal level based on the measured bit error rate; and signal processing means for adding, to the received digital broadcast signal, noise an amount of which is changed in accordance the measured bit error rate in a mode of displaying the reception signal level.

According to another aspect of the invention, there is provided a digital broadcast receiver comprising amplifying means for amplifying a received digital broadcast signal; amplitude detecting means for detecting an amplitude of an output signal of the amplifying means; generating means for generating a reference value; and amplification control means for controlling a gain of the amplifying means based on a result of comparison between the detected amplitude and the reference value; measuring means for measuring a bit error rate of the output signal of the amplifying means; and display means for displaying a reception signal level based on the measured bit error rate, wherein the generating means changes the reference value in accordance with the measured bit error rate.

According to a further aspect of the invention, there is provided a method for displaying a signal level of a received digital broadcast signal, comprising the steps of measuring a bit error rate of the received digital broadcast signal; adding, to the received digital broadcast signal, an amount of noise which is changed in accordance with the measured bit error signal; and displaying a reception signal level based on the measured bit error rate.

DESCRIPTION OF THE PREFERRED EMBODIMENT

An embodiment of the present invention will be hereinafter described in detail with reference to the accompanying drawings.

Figure 1:
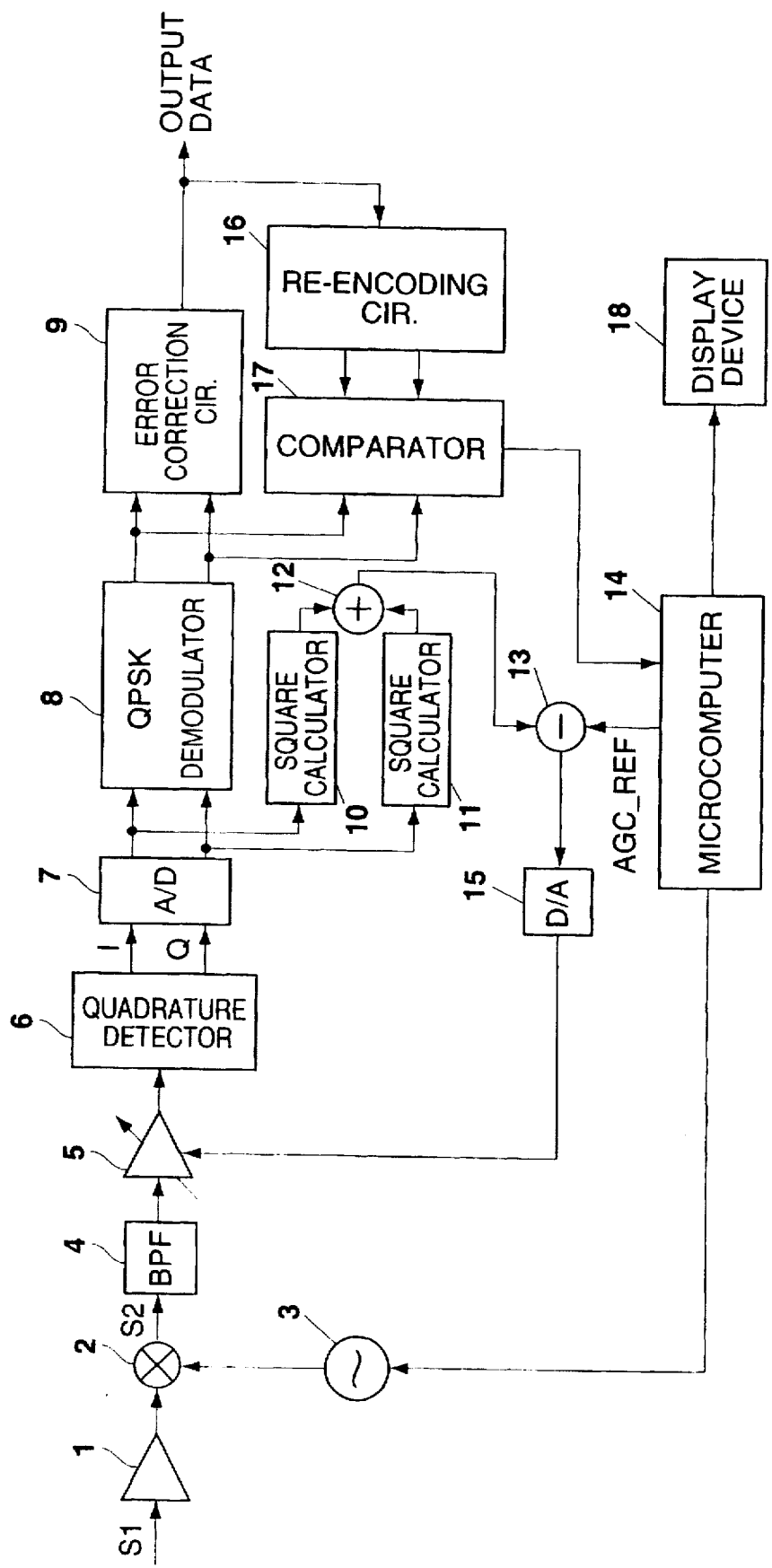
FIG. 1 is a block diagram showing the configuration of the main part of a digital satellite broadcast receiver to which the invention is applied.

FIG. 1 is a block diagram showing the configuration of the main part of a digital satellite broadcast receiver to which the invention is applied.

This digital satellite broadcast receiver has the following components. An amplifier 1 amplifies a first intermediate frequency (hereinafter abbreviated as IF) signal S1. A mixer 2 converts an output of the amplifier 1 into a second IF signal S2. A local oscillator 3 generates a local signal to be supplied to the mixer 2. A bandpass filter 4 eliminates unnecessary components from an output of the mixer 2. An AGC amplifier 5 adjust the level of an output of the bandpass filter 4. A quadrature detector 6 performs quadrature detection on an output of the AGC amplifier 5 to generate I-axis and Q-axis analog baseband signals (hereinafter referred to as an I signal and a Q signal, respectively). An A/D converter 7 digitizes the I and Q signals. A QPSK demodulator 8 demodulates digitized I and Q signals. An error correction circuit 9 corrects errors in demodulated data.

Square calculators 10 and 11 calculate squares of the digitized I and Q signals, respectively. An adder 12 calculates a sum of output signals of the square calculators 10 and 11. A subtracter 13 calculates a difference between an output of the adder 12 and an AGC reference voltage (hereinafter referred to as "AGC_REF") generated by a microcomputer 14. The microcomputer 14 performs control of the entire digital satellite broadcast receiver and other processing. A D/A converter 15 converts an output of the subtracter 13 into an analog signal and supplies it to the AGC amplifier 5 as a gain control voltage.

Re-encoding circuit 16 again encodes an output of the error correction circuit 9. A comparator 17 calculates an error rate by comparing an output of the re-encoding circuit 16 and an output of the QPSK demodulator 8. A display device 18 displays an antenna level that is generated by the microcomputer 14 based on the calculated error rate value.

In the digital satellite broadcast receiver of FIG. 1, a signal of the 12 GHz band transmitted from a satellite is received by an antenna (not shown) and converted by a converter (not shown) into a first IF signal S1 of the 1 GHz band, which is input to the amplifier 1. In the mixer 2, an amplified IF signal is mixed with an output of the local oscillator 3 having a frequency corresponding to a reception channel that is set by a user and thereby frequency-converted into a second IF signal S2 of the 480 MHz band. Unnecessary components included in an output of the mixer 2 are eliminated by the bandpass filter 4. In the AGC amplifier 5, an output of the bandpass filter 4 is gain-controlled to have a constant level based on a gain control voltage that is supplied from the D/A converter 15. An output of the AGC amplifier 5 is converted into orthogonal I and Q signals by the quadrature detector 6. The I and Q signals are digitized by the A/D converter 7 and then demodulated by the QPSK demodulator 8. Resulting demodulation outputs are subjected to error correction in the error correction circuit 9 and become bit stream output data, which is supplied to an MPEG2 decoder (not shown) of the following stage, for instance.

Referring to FIG. 1, to make the input level of the A/D converter 7 constant, digitized I and Q signals that are output from the A/D converter 7 are respectively squared by the square calculators 10 and 11 and then added together by the adder 12 to generate a sum-of-squares signal. A difference between the sum-of-squares signal and AGC_REF which is supplied from the microcomputer 14 is calculated by the subtracter 13 and then converted by the D/A converter 15 into an analog signal, which is supplied to the AGC amplifier 5 as the gain control voltage. In this manner, the gain of the AGC amplifier 5 is automatically controlled so that the sum of squares of the I and Q signals becomes equal to AGC_REF.

Further, an error rate is determined by again adding error correction codes to the output of the error correction circuit 9 by the re-encoding circuit 16, and resulting data is compared, by the comparator 17, with the data before being subjected to the error correction. The error rate is taken by the microcomputer 14 and then supplied to the display device 18 after being converted into an analog level.

Figure 2:
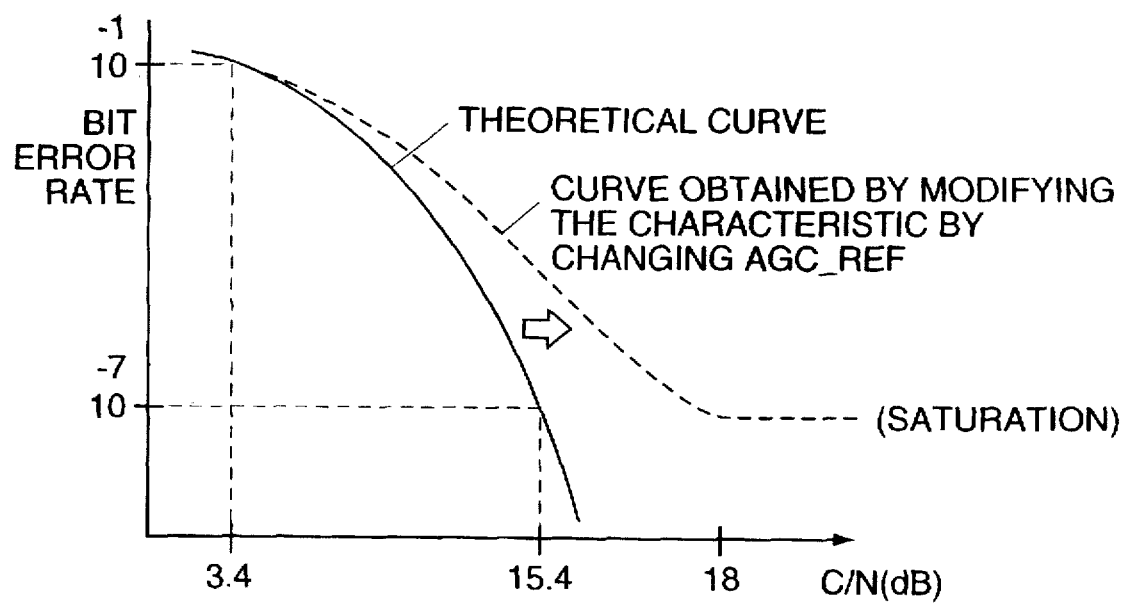
FIG. 2 shows a theoretical curve and a curve modified by the invention of the relationship between the bit error rate and the reception C/N value.

In the case of digital transmission, it is the best to use the C/N value as the antenna level value. As shown in FIG. 2 as a theoretical curve, the bit error rate and the C/N value can be correlated with each other one to one.

From the nature of the bit error rate, although the bit error rate can be calculated instantaneously when there occur many errors, the calculation takes long time when there occur only a small number of errors. This is because the average time necessary for detection of one error is represented by $1/(R \cdot E)$ [sec] where R is the transmission rate [bps] and E is the bit error rate.

However, in the receiver of FIG. 1, since the antenna level is displayed on the screen of the display device 18, it cannot be used for an antenna adjustment unless it is displayed in 0.5–1 second. With an assumption that the display updating time is one second, a C/N value range of 15–16 dB is a limit range of the error detection and antenna level display in the case of the example of Table 1. If the C/N value is larger (error rate is lower) than the above range, an error-free state is established and hence the error detection and antenna level display cannot be performed.

Figure 3:
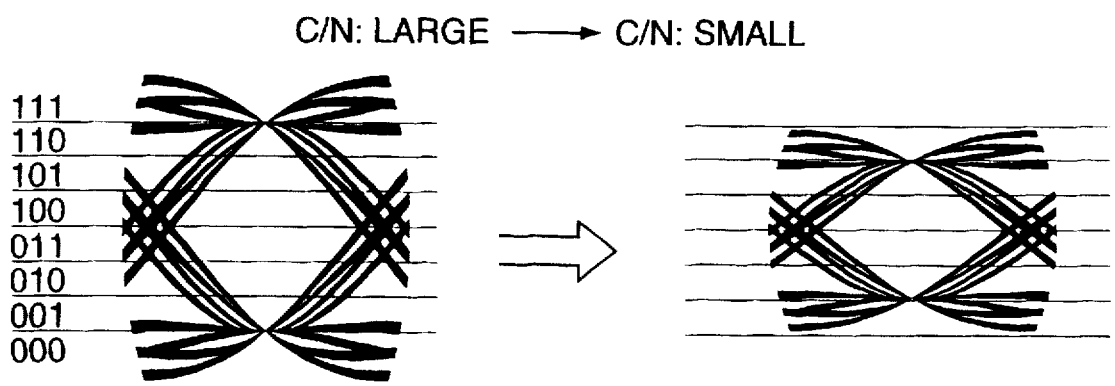
FIG. 3 shows that the quantization noise increases as the C/N value is decreased by reducing the amplitudes of input signals of the A/D converter 7.

In view of the above, according to this embodiment, the antenna level display is performed such that the bit error rate vs. C/N value characteristic is changed to one indicated by a dashed line in FIG. 2 in accordance with a bit error value (having a corresponding C/N value) taken by the microcomputer 14. That is, for a large C/N value, noise is added equivalently to reduce the apparent C/N value. Specifically, as the bit error rate value decreases, the level of AGC_REF is lowered, to thereby make the amplitudes of input signals of the A/D converter 7 smaller than the optimum values, whereby the quantization noise is increased and hence the C/N value is decreased equivalently. Eye patterns of FIG. 3 show that the quantization noise increases as the C/N value is decreased by reducing the amplitudes of input signals of the A/D converter 7.

Figure 4:
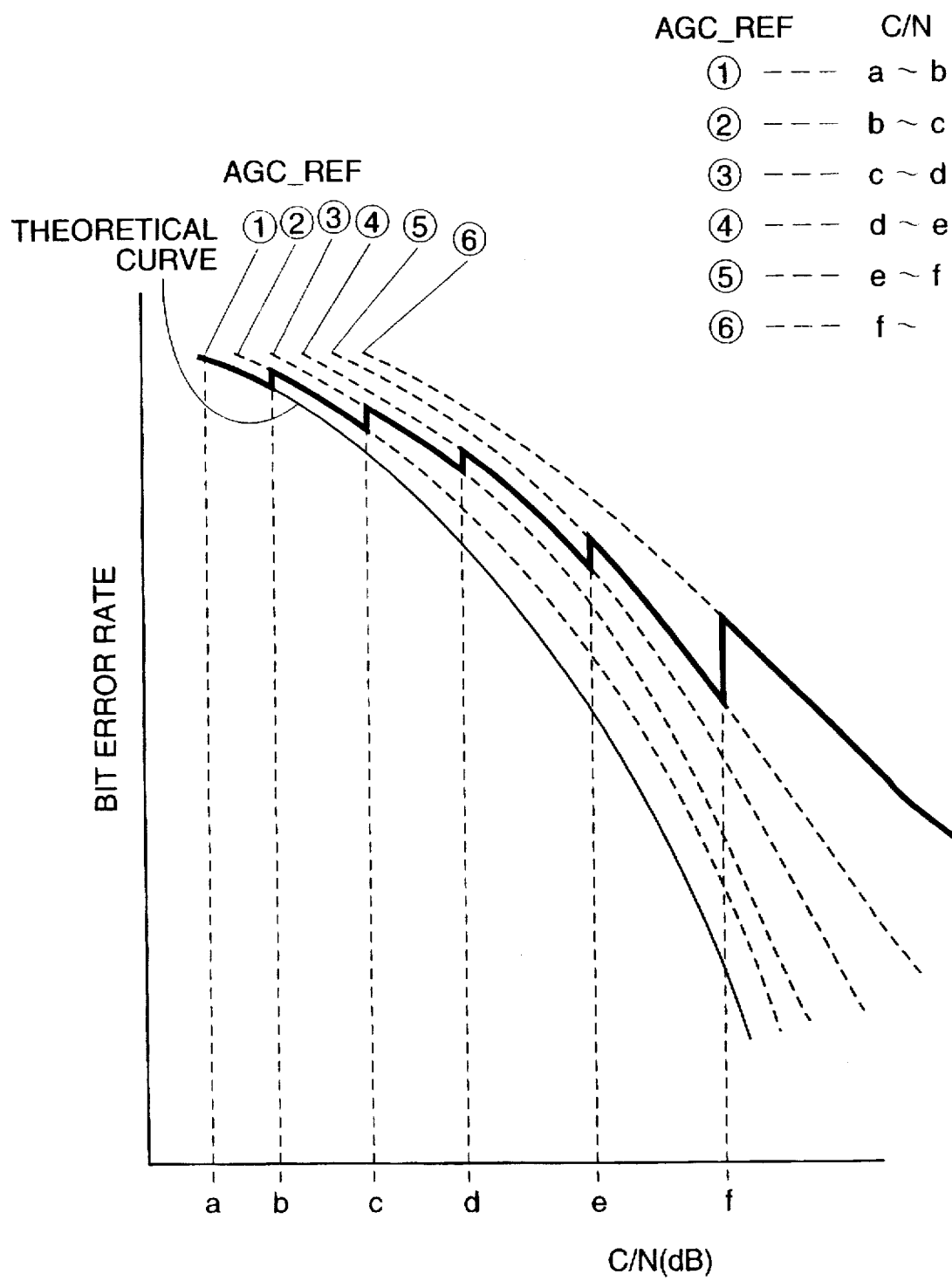
FIG. 4 shows how AGC_REF is changed in accordance with the bit error rate.

FIG. 4 shows how AGC_REF is changed in accordance with the bit error rate. In FIG. 4, curve (1) is a theoretical curve and curves (2)–(6) are curves obtained by shifting the theoretical curve (1) rightward, in other words, curves obtained by decreasing the C/N value equivalently by reducing AGC_REF. As indicated in FIG. 4, curves (2)–(6) are selected in this order as the reception C/N value increases. With this processing, as shown in FIG. 2, the C/N value range corresponding to the bit error rate range of $10^{-1}$ to $10^{-7}$ is converted from the theoretical range of 3.4–15.4 dB to 3.4–18 dB. Further, a measure is taken so that the bit error rate does not become smaller than $10^{-7}$. As a result, the C/N value range that can be displayed can be made wider by 2–3 dB than with the theoretical curve. Apparently the above processing is performed only when the receiver operates according to an antenna level display menu, and is not performed in an ordinary receiving state because it would cause regular deterioration in characteristics.

It goes without saying that a program and data to provide the above modified characteristic are stored in a memory (ROM) in the microcomputer 14. Although the above embodiment is described as using six curves for convenience of description, in an actual receiver a smooth characteristic as indicated by the dashed line in FIG. 2 is attained by using a number of curves.

As described above, according to the invention, since the C/N value range that can be displayed can be widened, the reception quality measurement range can be increased. Thus, the antenna direction can be adjusted with higher accuracy.

Further, the invention can easily be embodied only by changes in software and requires no changes in hardware.

What is claimed is:

1. A digital broadcast receiver comprising:
   measuring means for measuring a bit error rate of a received digital broadcast signal;
   display means for displaying a reception signal level based on the measured bit error rate; and signal processing means for adding, to the received digital broadcast signal, an amount of noise which is changed according to the measured bit error rate in a mode of displaying the reception signal level, and for ceasing to add said amount of noise to the received digital broadcast signal in a non-displaying mode.

2. The digital broadcast receiver according to claim 1, wherein the measuring means comprises:

error correcting means for performing an error correcting operation on the digital broadcast signal;

error correction encoding means for performing error correction encoding on an output signal of the error correcting means; and comparing means for comparing an input signal of the error correcting means with an output signal of the error correction encoding means.

3. The digital broadcast receiver according to claim 1, wherein the signal processing means comprises amplifying means for amplifying the received digital broadcast signal, a gain of the amplifying means being changed in accordance with the measured bit error rate.

4. The digital broadcast receiver according to claim 3, wherein the signal processing means further comprises:

detecting means for detecting an amplitude of an output signal of the amplifying means;

generating means for generating a reference value; and amplification control means for controlling the gain of the amplifying means based on a result of comparison between the detected amplitude and the reference value.

5. A digital broadcast receiver comprising:

amplifying means for amplifying a received digital broadcast signal;

amplitude detecting means for detecting an amplitude of an output signal of the amplifying means;

generating means for generating a reference value; and amplification control means for controlling a gain of the amplifying means based on a result of comparison between the detected amplitude and the reference value;

measuring means for measuring a bit error rate of the output signal of the amplifying means; and display means for displaying a reception signal level based on the measured bit error rate, wherein the generating means changes the reference value in accordance with the measured bit error rate.

6. The digital broadcast receiver according to claim 5, wherein the generating means generates the reference value so that the amplitude of the output signal of the amplifying means is decreased as the measured bit error rate decreases.

7. The digital broadcast receiver according to claim 6, further comprising:

detecting means for quadrature-detecting the output signal of the amplifying means;

A/D-converting means for A/D-converting an output signal of the detecting means;

demodulating means for demodulating an output signal of the A/D-converting means; and and error correcting means for performing error correcting operation on an output signal of the demodulating means.

8. The digital broadcast receiver according to claim 7, wherein the amplitude detecting means determines the amplitude by calculating a sum of squares of I and Q signals that are output from the A/D-converting means.

9. The digital broadcast receiver according to claim 8, wherein the amplification control means comprises:

subtracting means for determining a difference between an output signal of the amplitude detecting means and the reference value; and a D/A-converting means for D/A-converting an output signal of the subtracting means.

10. The digital broadcast receiver according to claim 7, wherein the measuring means comprises:

error correction encoding means for performing error correction encoding on an output signal of the error correcting means; and comparing means for comparing an input signal of the error correcting means with an output signal of the error correction encoding means.

11. A method for displaying a signal level of a received digital broadcast signal, comprising the steps of:

measuring a bit error rate of the received digital broadcast signal;

adding, to the received digital broadcast signal, an amount of noise which is changed according to the measured bit error rate in a mode of displaying the reception signal level, and ceasing to add said amount of noise to the received digital broadcast signal in a non-displaying mode; and displaying a reception signal level based on the measured bit error rate.

12. The method according to claim 11, further comprising the steps of:

performing an error correcting operation on the digital broadcast signal;

again performing error correction encoding on an error-corrected signal; and measuring the bit error rate by comparing a signal before being subjected to the error correcting operation with an error-correction-encoded signal.

13. The method according to claim 11, wherein the noise is added to the received digital broadcast signal by changing a gain of an amplifier circuit for amplifying the received digital broadcast signal.

14. The method according to claim 13, wherein the gain of the amplifier circuit is changed by:

detecting an amplitude of an output signal of the amplifier circuit;

generating a reference value; and changing the gain of the amplifier circuit based on a difference between the detected amplitude and the reference value.

15. A digital broadcast receiver, comprising:

measuring means for measuring a bit error rate of a received digital broadcast signal;

signal processing means for adding, to the received digital broadcast signal, an amount of noise which is changed according to the measured bit error rate, said signal processing means including amplifying means for amplifying the received digital broadcast signal, detecting means for detecting an amplitude of an output signal of the amplifying means, generating means for generating a reference value according to said bit error rate, and amplification control means for controlling the gain of the amplifying means based on a result of comparison between the detected amplitude and the reference value; wherein said amount of noise is determined according to said gain of the amplifying means; and display means for displaying a reception signal level based on the measured bit error rate.

16. A method for displaying a signal level of a received digital broadcast signal, comprising the steps of:

providing an amplifier circuit for amplifying the received digital broadcast signal;

measuring a bit error rate of the received digital broadcast signal;

adding, to the received digital broadcast signal, an amount of noise which is changed according to the measured bit error signal by detecting an amplitude of an output signal of the amplifier circuit, generating a reference value, and changing the gain of the amplifier circuit based on a difference between the detected amplitude and the reference value; and displaying a reception signal level based on the measured bit error rate.

* * * * *